(12) United States Patent
Shih

(10) Patent No.: US 11,251,128 B2
(45) Date of Patent: Feb. 15, 2022

(54) SEMICONDUCTOR DEVICE STRUCTURE WITH AIR GAP FOR REDUCING CAPACITIVE COUPLING

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 80 days.

(21) Appl. No.: 16/787,367

(22) Filed: Feb. 11, 2020

(65) Prior Publication Data

US 2021/0249354 A1   Aug. 12, 2021

(51) Int. Cl.
| | | |
|---|---|---|
| *H01L 23/532* | (2006.01) | |
| *H01L 23/528* | (2006.01) | |
| H01L 23/522 | (2006.01) | |
| H01L 21/768 | (2006.01) | |

(52) U.S. Cl.
CPC ........ *H01L 23/5329* (2013.01); *H01L 23/528* (2013.01); *H01L 21/76877* (2013.01); *H01L 23/5226* (2013.01)

(58) Field of Classification Search
CPC ............... H01L 23/5329; H01L 23/528; H01L 23/5226; H01L 21/76877
See application file for complete search history.

(56) References Cited

U.S. PATENT DOCUMENTS

| | | | |
|---|---|---|---|
| 8,624,399 B2 * | 1/2014 | Usami ............... | H01L 21/76807 |
| | | | 257/773 |
| 10,204,826 B1 * | 2/2019 | Hsu ..................... | H01L 29/7843 |
| 2020/0006329 A1 * | 1/2020 | Lilak ..................... | H01L 24/32 |
| 2020/0388565 A1 * | 12/2020 | Lin ..................... | H01L 21/7682 |

* cited by examiner

*Primary Examiner* — Patricia D Valenzuela
(74) *Attorney, Agent, or Firm* — Muncy, Geissler, Olds & Lowe, P.C.

(57) ABSTRACT

The present disclosure provides a semiconductor structure and a method for preparing the semiconductor structure. The semiconductor device structure includes: a first conductive structure and a second conductive structure disposed at different vertical heights over a semiconductor substrate; a first conductive plug and a second conductive plug correspondingly disposed over the first conductive structure and the second conductive structure; a first spacer disposed on a sidewall surface of the first conductive plug; an etch stop layer disposed over the semiconductor substrate, wherein the etch stop layer adjoins the first spacer; and a first inter-layer dielectric (ILD) layer disposed over the etch stop layer and next to the first conductive plug, wherein the first ILD layer is separated from the first spacer by an air gap.

20 Claims, 10 Drawing Sheets

SEMICONDUCTOR DEVICE STRUCTURE WITH AIR GAP FOR REDUCING CAPACITIVE COUPLING

TECHNICAL FIELD

The present disclosure e relates to a semiconductor device structure, and more particularly, to a semiconductor device structure with air gaps between two conductive features for reducing capacitive coupling.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as parasitic capacitive coupling between adjacent conductive elements, which results in unwanted resistive-capacitive (RC) delay. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure comprises: a first conductive structure and a second conductive structure disposed at different vertical heights over a semiconductor substrate; a first conductive plug and a second conductive plug correspondingly disposed over the first conductive structure and the second conductive structure; a first spacer disposed on a sidewall surface of the first conductive plug; an etch stop layer disposed over the semiconductor substrate, wherein the etch stop layer adjoins the first spacer; and a first inter-layer dielectric (ILD) layer disposed over the etch stop layer and next to the first conductive plug, wherein the first ILD layer is separated from the first spacer by an air gap.

In some embodiments, the semiconductor device structure further comprises: a second spacer disposed over the etch stop layer, wherein the second spacer is between the first spacer and the ILD layer, and the air gap is over the second spacer.

In some embodiments, the second spacer does not overlap the conductive structure in a direction perpendicular to a top surface of the semiconductor substrate.

In some embodiments, the semiconductor device structure further comprises: a second ILD layer disposed over the first ILD layer, wherein the air gap is enclosed by the second ILD layer, the first ILD layer, the second s pacer and the first spacer.

In some embodiments, the semiconductor device structure further comprises: a first conductive contact disposed over the first conductive plug, wherein the first conductive contact is surrounded by the second ILD layer, and the first conductive contact is electrically connected to the first conductive plug.

In some embodiments, a bottom surface of the etch stop layer is at a vertical height over a top surface of the first conductive structure.

In some embodiments, the first conductive plug has a first height, the second conductive plug has a second height, and the second height is greater than the first height.

In some embodiments, the first conductive plug has a first top surface, the second conductive plug has a second top surface, and the second top surface is substantially level with the first top surface.

In some embodiments, the first conductive plug has a first height, the second conductive plug has a second height, the first conductive structure has a third height, and the second height is substantially the same as a summation of the first height and the third height.

In some embodiments, the first conductive plug has a bottom surface substantially level with a bottom surface of the etch stop layer, and the second conductive plug has a bottom surface substantially lower than the bottom surface of the etch stop layer.

In another embodiment of the present disclosure, a semiconductor device structure is provided. The semiconductor device structure comprises: a first conductive structure and a second conductive structure disposed at different vertical heights over a semiconductor substrate; a first conductive plug and a second conductive plug correspondingly disposed over the first conductive structure and the second conductive structure, wherein the first conductive plug has a first height, the second conductive plug has a second height, and the second height is greater than the first height; a first spacer and a second spacer correspondingly disposed on a sidewall surface of the first conductive plug and a sidewall surface of the second conductive plug; an etch stop layer disposed over the conductive structure, wherein the etch stop layer adjoins a sidewall surface of the first spacer and a sidewall surface of the second spacer; a first inter-layer dielectric (ILD) layer disposed over the etch stop layer and next to the first spacer and the second spacer, wherein the first ILD layer is separated from the first spacer by a first air gap and the first ILD layer is separated from the second spacer by a second air gap; and a second ILD layer disposed over the first ILD layer, wherein the first air gap and the second air gap are sealed by the second ILD layer.

In some embodiments, the second spacer is between the air gap and the etch stop layer.

In some embodiments, a material of the second spacer is different from a material of the first spacer and a material of the first ILD layer.

In some embodiments, the first spacer and the etch stop layer are made of silicon nitride.

In some embodiments, a bottom surface of the etch stop layer is at a vertical height over a bottom surface of the first spacer.

In some embodiments, the air gap does not overlap the conductive structure in a direction perpendicular to a top surface of the semiconductor substrate.

In some embodiments, the first conductive plug has a first height, the second conductive plug has a second height, and the second height is greater than the first height.

In some embodiments, the first conductive plug has a first top surface, the second conductive plug has a second top surface, and the second top surface is substantially level with the first top surface.

In some embodiments, the first conductive plug has a first height, the second conductive plug has a second height, the first conductive structure has a third height, and the second height is substantially the same as a summation of the first height and the third height.

In some embodiments, the first conductive plug has a bottom surface substantially level with a bottom surface of the etch stop layer, and the second conductive plug has a bottom surface substantially lower than the bottom surface of the etch stop layer.

Embodiments of a semiconductor device structure are provided in accordance with some embodiments of the disclosure. The semiconductor device structure includes a conductive plug over a conductive structure, a first spacer on a sidewall surface of the conductive plug, and an inter-layer dielectric (ILD) layer next to the conductive plug. Because the first spacer and the ILD layer have an air gap therebetween, the parasitic capacitance between the conductive plug and another adjacent conductive element may be reduced. As a result, the operation speeds of the semiconductor device structure may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
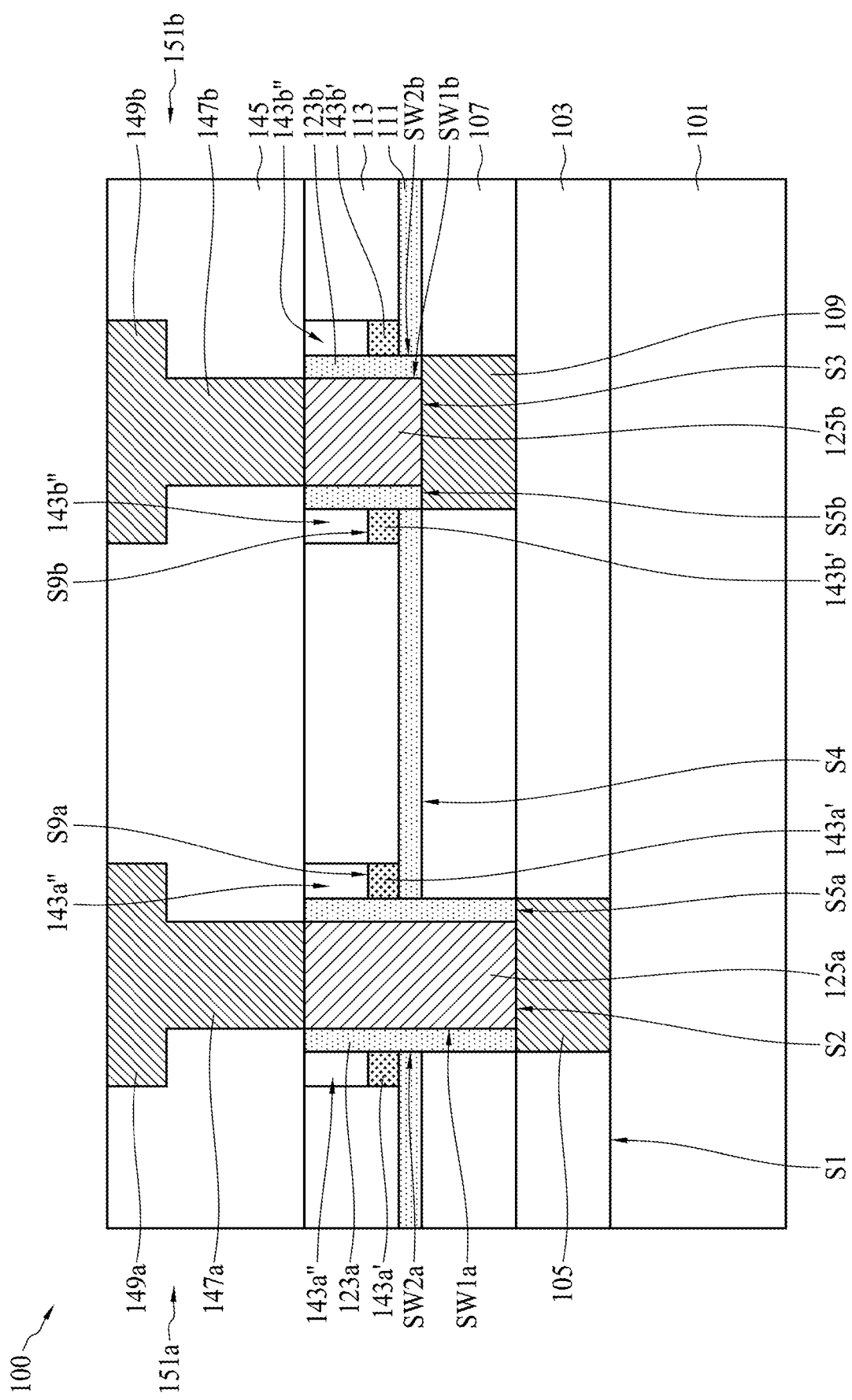
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes an inter-layer dielectric (ILD) layer 103 and a conductive structure 105 over a semiconductor substrate 101, in accordance with some embodiments. Specifically, in some embodiments, the conductive structure 105 is surrounded by (or embedded in) the ILD layer 103.

Moreover, the semiconductor device structure 100 also includes an ILD layer 107 and a conductive structure 109 over the ILD layer 103. Similar to the conductive structure 105, the conductive structure 109 is surrounded by (or embedded in) the ILD layer 107, and the conductive structures 105 and 109 do not overlap in the direction perpendicular to the top surface S1 of the semiconductor substrate 101, as shown in FIG. 1 in accordance with some embodiments.

In some embodiments, the semiconductor device structure 100 further includes an etch stop layer 111 over the ILD layer 107, and an ILD layer 113 over the etch stop layer 111. In addition, in some embodiments, the semiconductor device structure 100 includes a conductive plug 125a and first spacers 123a penetrating through the ILD layer 113, the etch stop layer 111 and the ILD layer 107, and also includes a conductive plug 125b and first spacers 123b penetrating through the ILD layer 113 and the etch stop layer 111.

Moreover, the conductive plug 125a and the first spacers 123a are disposed over the top surface S2 of the conductive structure 105, and the first spacers 123a are disposed on the sidewall surfaces SW1a of the conductive plug 125a. Similarly, the conductive plug 125b and the first spacers 123b are disposed over the top surface S3 of the conductive structure 109, and the first spacers 123b are disposed on the sidewall surfaces SW1b of the conductive plug 125b. It should be noted that the top surface S3 of the conductive structure 109 is higher than the top surface S2 of the conductive structure 105.

Still referring to FIG. 1, the semiconductor device structure 100 includes second spacers 143a' and air gaps 143a" between the first spacers 123a and the ILD layer 113, and the air gaps 143a" are over the second spacers 143a'. Similarly, the semiconductor device structure 100 also includes second spacers 143b' and air gaps 143b" between the first spacers 123b and the ILD layer 113, wherein the air gaps 143b" are over the second spacers 143b'. In some embodiments, the second spacers 143a' are disposed on the sidewall surfaces SW2a of the first spacers 123a, and the etch stop layer 111 adjoins the sidewall surface SW2a of the first spacers 123a. Similarly, the second spacers 143b' are disposed on the sidewall surfaces SW2b of the first spacers 123b, and the etch stop layer 111 adjoins the sidewall surface SW2b of the first spacers 123b, in accordance with some embodiments.

It should be noted that, in some embodiments, the air gaps 143a" do not overlap the conductive structure 105 in the direction perpendicular to the top surface S1 of the semiconductor substrate 101, and the air gaps 143b" do not overlap the conductive structure 109 in the direction perpendicular to the top surface S1 of the semiconductor substrate 101. In addition, the second spacers 143a' do not overlap the conductive structure 105 in the direction perpendicular to the top surface S1 of the semiconductor substrate 101, and the second spacers 143b' do not overlap the conductive structure 109 in the direction perpendicular to the top surface S1 of the semiconductor substrate 101, in accordance with some embodiments.

Moreover, the semiconductor device structure 100 includes an ILD layer 145 over the ILD layer 113, in accordance with some embodiments. Specifically, the ILD layer 113 and the first spacers 123a, 123b are covered by the ILD layer 145, and the top portions of the air gaps 143a" and 143b" are sealed by the ILD layer 145. The semiconductor device structure 100 also includes conductive structures 151a and 151b penetrating through the ILD layer 145, in accordance with some embodiments.

As shown in FIG. 1, the conductive structure 151a includes a conductive contact 147a and an interconnect layer 149a over the conductive contact 147a, and the conductive structure 151b includes a conductive contact 147b and an interconnect layer 149b over the conductive contact 147b. It should be noted that the conductive structure 151a is electrically connected to the conductive structure 105 through the conductive plug 125a, and the conductive structure 151b is electrically connected to the conductive structure 109 through the conductive plug 125b.

Furthermore, the bottom surface S4 of the etch stop layer 111 is higher than the top surface S2 of the conductive structure 105 and the bottom surface S5a of the first spacers 123a, in accordance with some embodiments. In addition, the bottom surface S4 of the etch stop layer 111 is level with the top surface S3 of the conductive structure 105 and the bottom surface S5b of the first spacers 123b, in accordance with some embodiments. In some embodiments, the semiconductor device structure 100 includes one or more field-effect transistors (FET).

Figure 2:
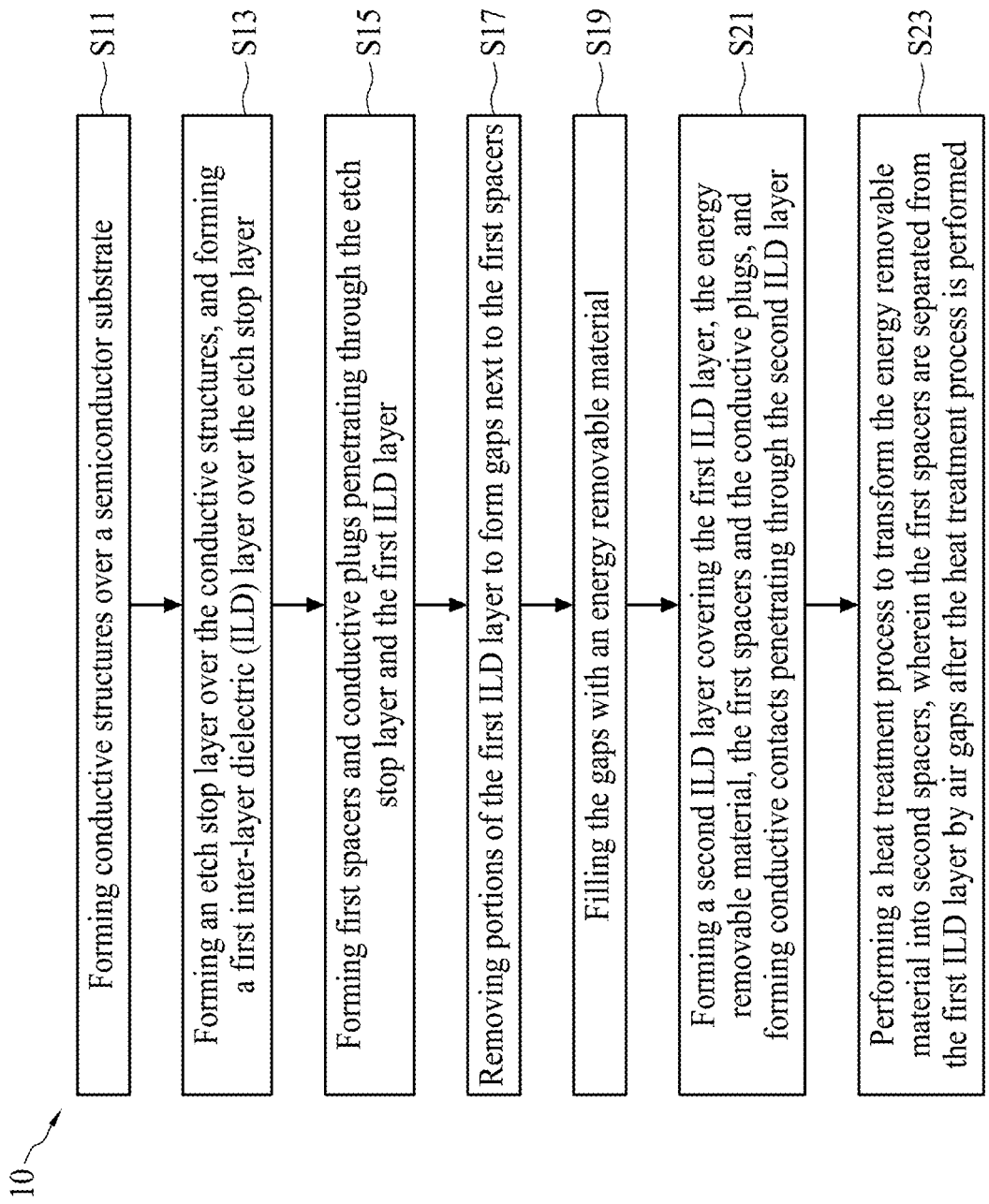
FIG. 2 is a flow diagram illustrating a method for forming a semiconductor device structure, in accordance with some embodiments.

FIG. 2 is a flow diagram illustrating a method 10 for forming the semiconductor device structure 100, and the method 10 includes steps S11, S13, S15, S17, S19, S21 and S23, in accordance with some embodiments. The steps S11 to S23 of FIG. 2 are elaborated in connection with following figures.

FIGS. 3 to 10 are cross-sectional views illustrating intermediate stages in the formation of the semiconductor device structure 100, in accordance with some embodiments.

Figure 3:
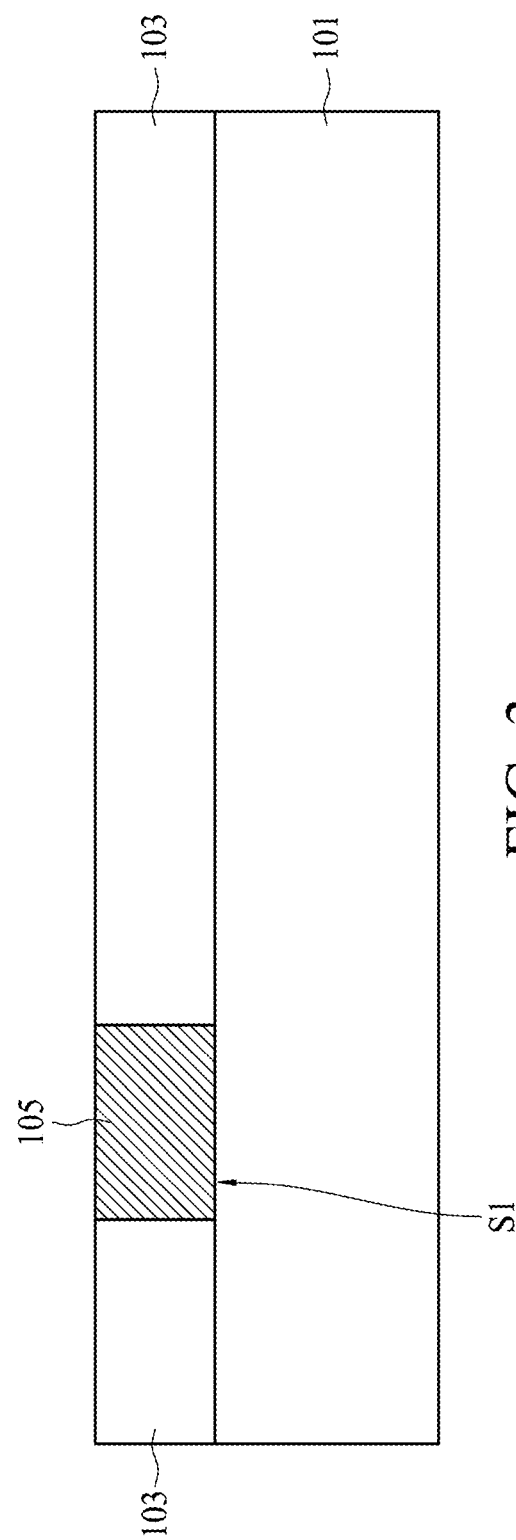
FIG. 3 is a cross-sectional view illustrating an intermediate stage in the formation of a semiconductor device structure, in accordance with some embodiments.

As shown in FIG. 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium and diamond. Examples of the compound semiconductor materials may include, but are not limited to, silicon carbide, gallium arsenic, gallium phosphide, indium phosphide, indium arsenide and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIG. 3, the ILD layer 103 is disposed over the semiconductor substrate 101, and the conductive structure 105 is formed in the ILD layer 103, in accordance with some embodiments.

In some embodiments, the ILD layer 103 is made of silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB) and polyimide. In addition, the ILD layer 103 may be formed by a chemical vapor deposition (CVD) process, a physical vapor deposition (PVD) process, an atomic layer deposition (ALD) process, a spin coating process, or another applicable process.

Moreover, in some embodiments, the conductive structure 105 is made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used.

In some embodiments, after the ILD layer 103 is formed, a portion of the ILD layer 103 is removed to form an opening (not shown) exposing the top surface S1 of the semiconductor substrate 101. The portion of the ILD layer 103 may be removed by an etching process, such as a dry etching process or a wet etching process. Next, a conductive material (not shown) is deposited in the opening and over the ILD layer 103. The deposition process may be CVD, PVD, ALD, metal organic CVD (MOCVD), sputtering, plating, or another applicable process. After the deposition process, a planarization process may be performed on the conductive material until the ILD layer 103 is exposed. In some embodiments, the planarization process is a chemical mechanical polishing (CMP) process.

Figure 4:
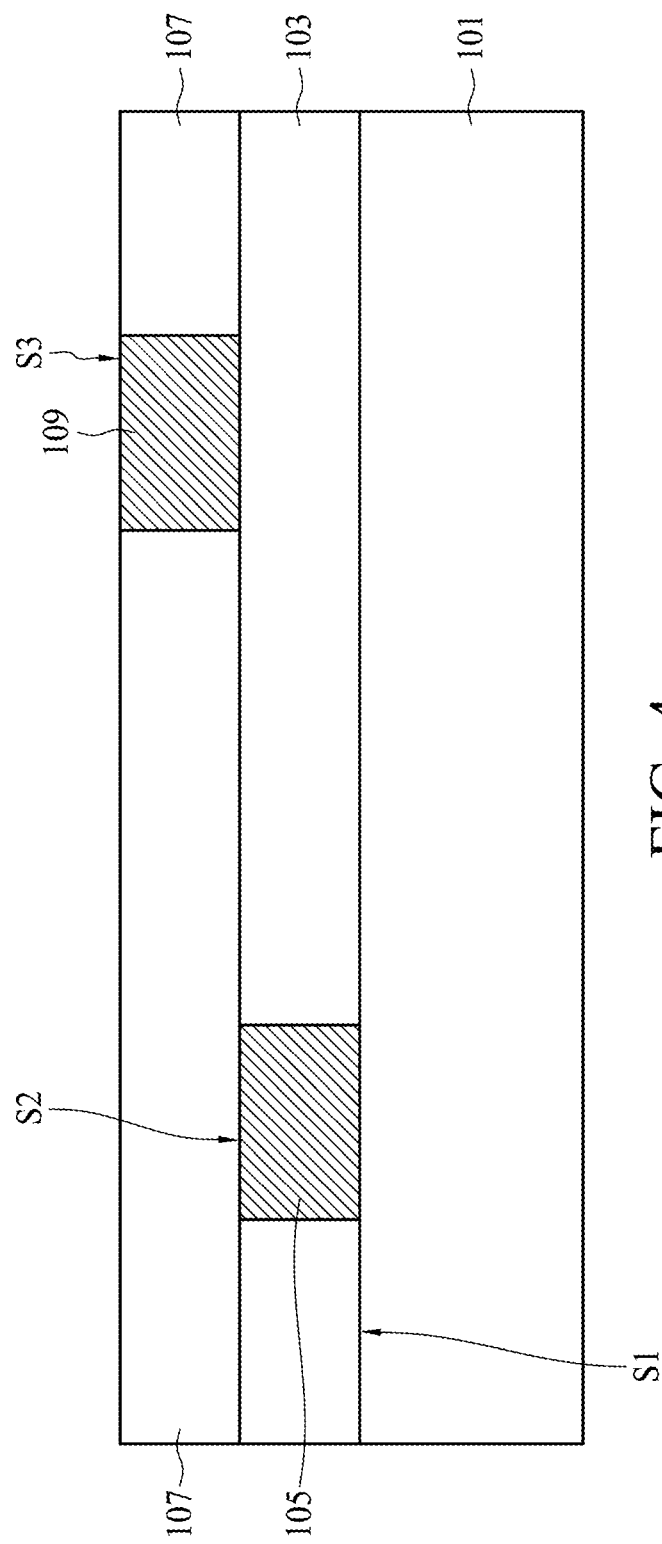
FIG. 4 is a cross-sectional view illustrating an intermediate stage in the formation of a semiconductor device structure, in accordance with some embodiments.

Next, the ILD layer 107 is disposed over the ILD layer 103 and the conductive structure 105, and the conductive structure 109 is formed in the ILD layer 107, as shown in FIG. 4 in accordance with some embodiments. The respective step is illustrated as the step S11 in the method 10 shown in FIG. 2.

Some processes and materials used to form the ILD layer 107 and the conductive structure 109 are similar to, or the same as, those used to form the ILD layer 103 and the conductive structure 105, and descriptions thereof are not repeated herein. It should be noted that, in some embodiments, the conductive structure 109 does not overlap the conductive structure 105 in the direction perpendicular to the top surface S1 of the semiconductor substrate 101. Moreover, in some embodiments, the top surface S3 of the conductive structure 109 is higher than the top surface S2 of the conductive structure 105.

Figure 5:
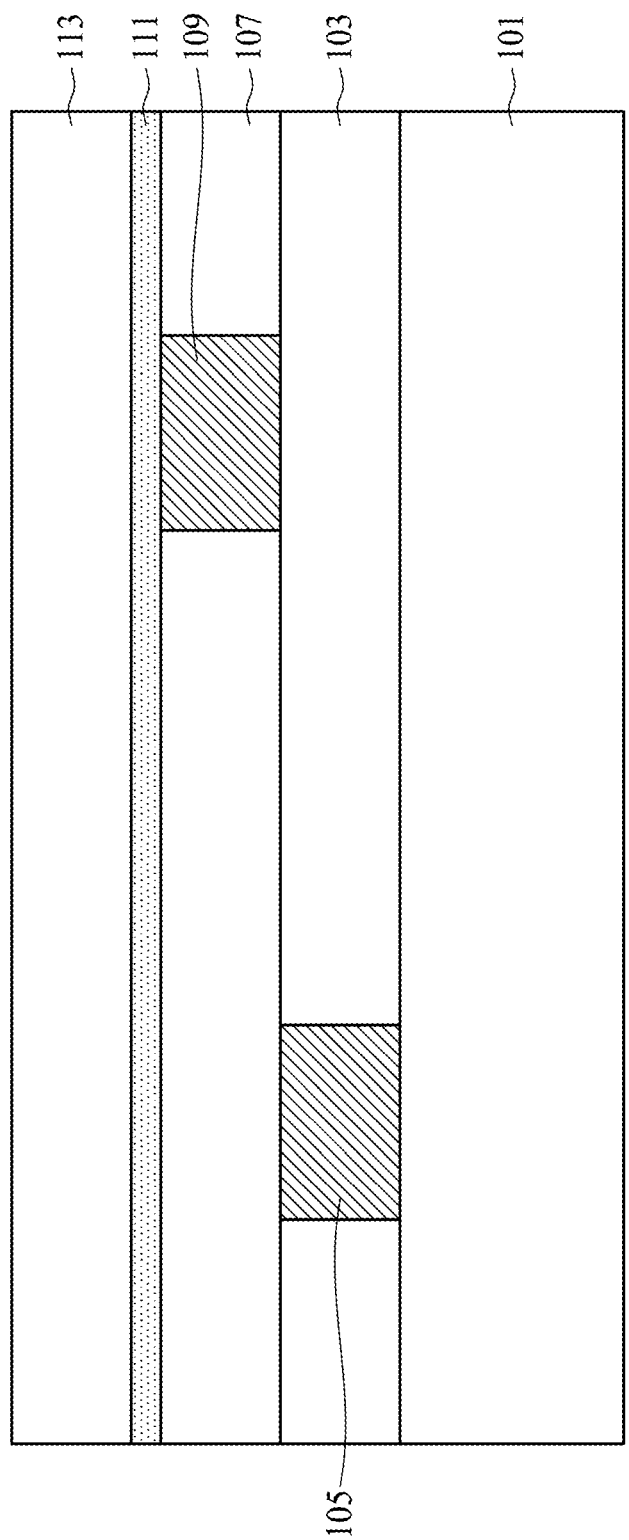
FIG. 5 is a cross-sectional view illustrating an intermediate stage in the formation of a semiconductor device structure, in accordance with some embodiments.

Next, the etch stop layer 111 is disposed over the ILD layer 107 and the conductive structure 109, and the ILD layer 113 is disposed over the etch stop layer 111, as shown in FIG. 5 in accordance with some embodiments. The respective step is illustrated as the step S13 in the method 10 shown in FIG. 2.

In some embodiments, the etch stop layer 111 is made of silicon nitride. In some other embodiments, the etch stop layer 111 is made of silicon oxide, silicon oxynitride, or another applicable material. The etch stop layer 111 may be formed by plasma-enhanced CVD, low-pressure CVD, ALD, or another applicable process. In addition, some processes and materials used to form the ILD layer 113 are similar to, or the same as, those used to form the ILD layer 103, and detailed descriptions thereof are not repeated herein.

Figure 6:
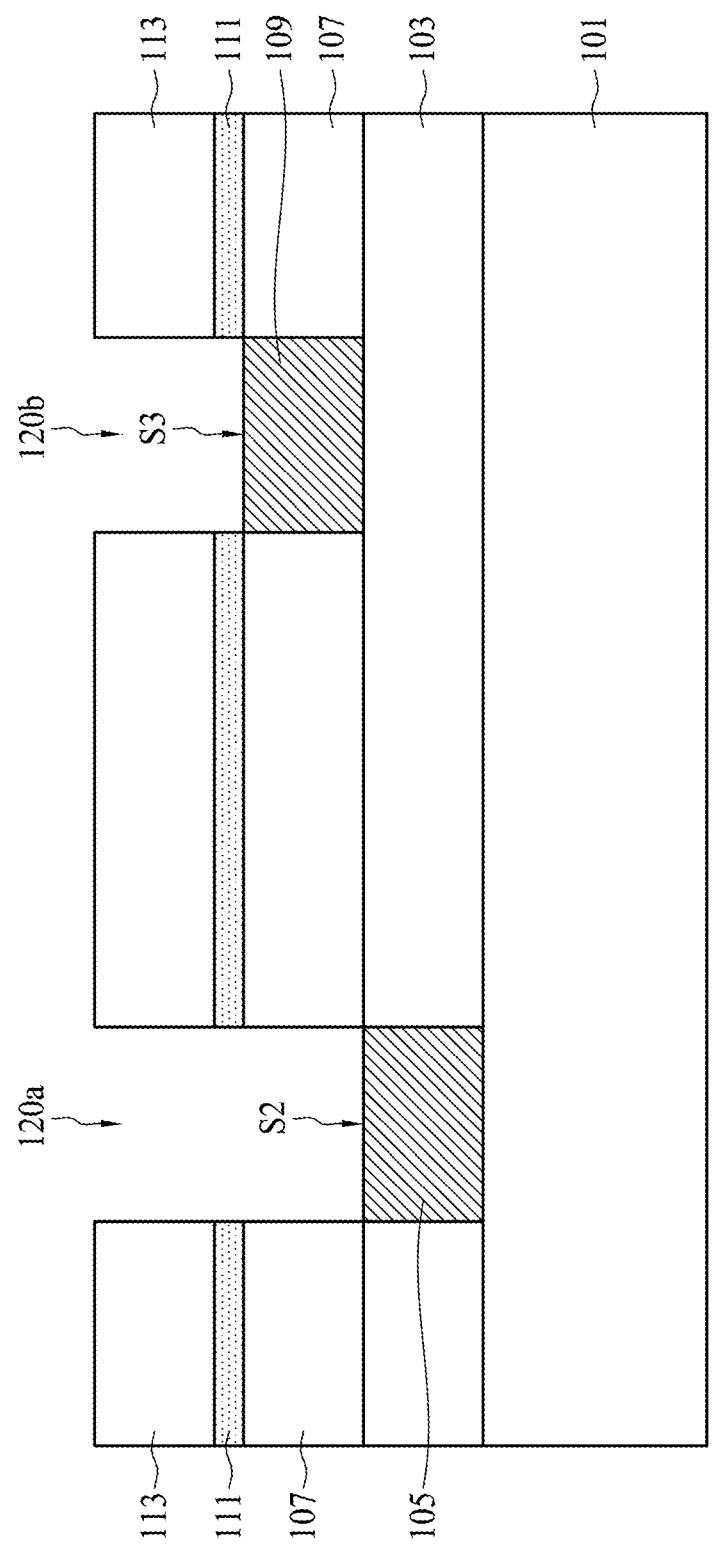
FIG. 6 is a cross-sectional view illustrating an intermediate stage in the formation of a semiconductor device structure, in accordance with some embodiments.

After the ILD layer 113 is formed, the ILD layer 113, the etch stop layer 111 and the ILD layer 107 are partially removed to form openings 120a and 120b, as shown in FIG. 6 in accordance with some embodiments. In some embodiments, the top surface S2 of the conductive structure 105 is exposed by the opening 120a, and the top surface S3 of the conductive structure 109 is exposed by the opening 120b.

Moreover, the openings 120a and 120b may be formed by a single etching process or by multiple etching processes (i.e., the openings 120a and 120b may be formed simultaneously or individually). The etching process may include a dry etching process, a wet etching process, or a combination thereof. It should be noted that the depth of the opening 120a is greater than the depth of the opening 120b, since the top surface S3 of the conductive structure 109 is higher than the top surface S2 of the conductive structure 105.

Figure 7:
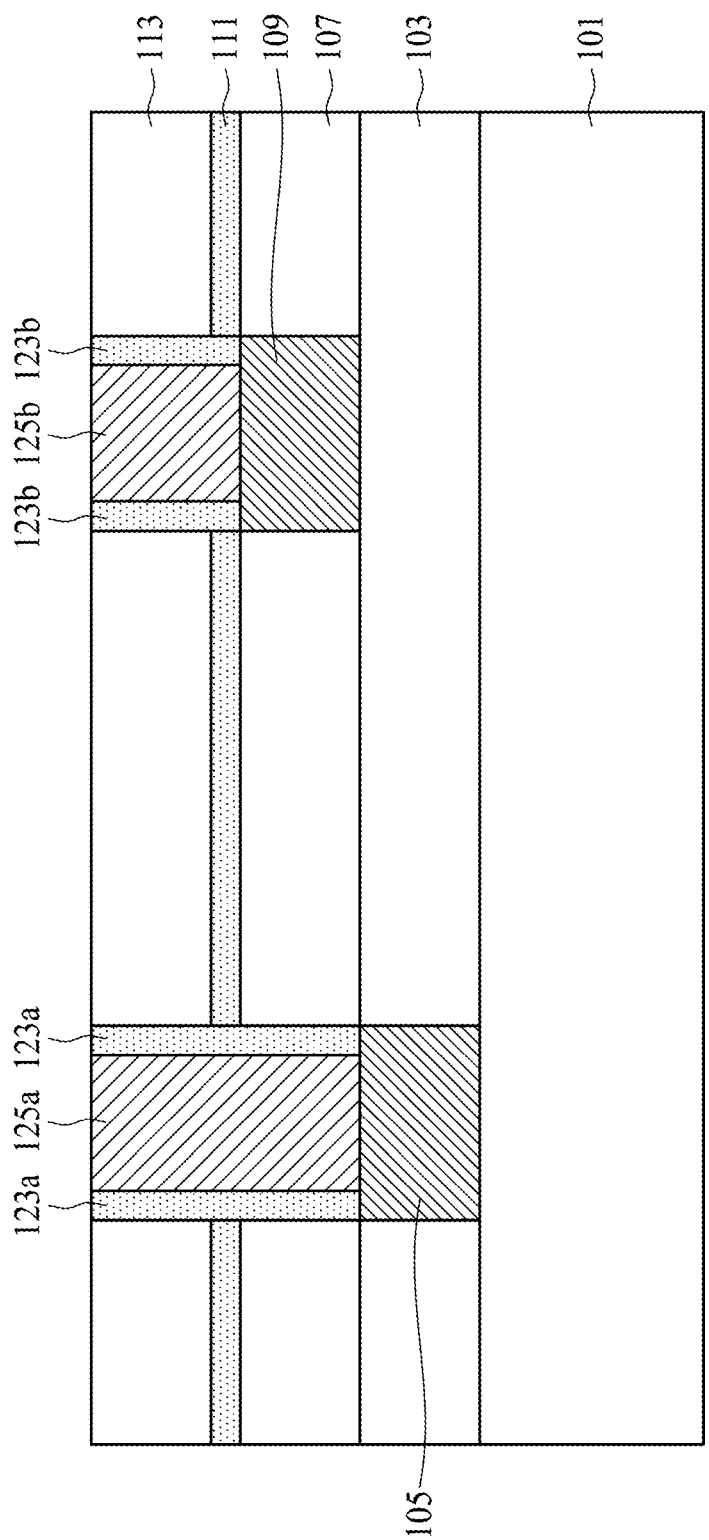
FIG. 7 is a cross-sectional view illustrating an intermediate stage in the formation of a semiconductor device structure, in accordance with some embodiments.

Next, first spacers 123a and a conductive plug 125a are formed in the opening 120a, and first spacers 123b and a conductive plug 125b are formed in the opening 120b, as shown in FIGS. 6 and 7 in accordance with some embodiments. The respective step is illustrated as the step S15 in the method 10 shown in FIG. 2. In some embodiments, the conductive plug 125a is separated from the ILD layer 113, the etch stop layer 111 and the ILD layer 107 by the first spacers 123a, and the conductive plug 125b is separated from the ILD layer 113 and the etch stop layer 111 by the first spacers 123b.

In some embodiments, the first spacers 123a and 123b are made of silicon nitride. In some other embodiments, the first spacers 123a and 123b are made of silicon oxide, silicon oxynitride, or another applicable material. In some embodiments, the first spacers 123a and 123b and the etch stop layer 111 are made of the same material, which is different from the material of the ILD layer 113. In addition, the first spacers 123a and 123b are formed by a deposition process and a subsequent planarization process, in accordance with some embodiments. The deposition process may be CVD, PVD, ALD, spin coating, or another applicable process, and the planarization process may be CMP.

Moreover, the conductive plugs 125a and 125b are made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used.

In some embodiments, after the first spacers 123a and 123b are formed so as to line the openings 120a and 120b, the remaining portions of the openings 120a and 120b are filled by the conductive plugs 125a and 125b, wherein the conductive plugs 125a and 125b are formed by a deposition process and a subsequent planarization process.

The deposition process may be CVD, PVD, ALD, MOCVD, sputtering, plating, or another applicable process, and the planarization process may be CMP. In some embodiments, the first spacers 123a, 123b and the conductive plugs 125a, 125b are obtained by a single planarization process after the materials are deposited.

Figure 8:
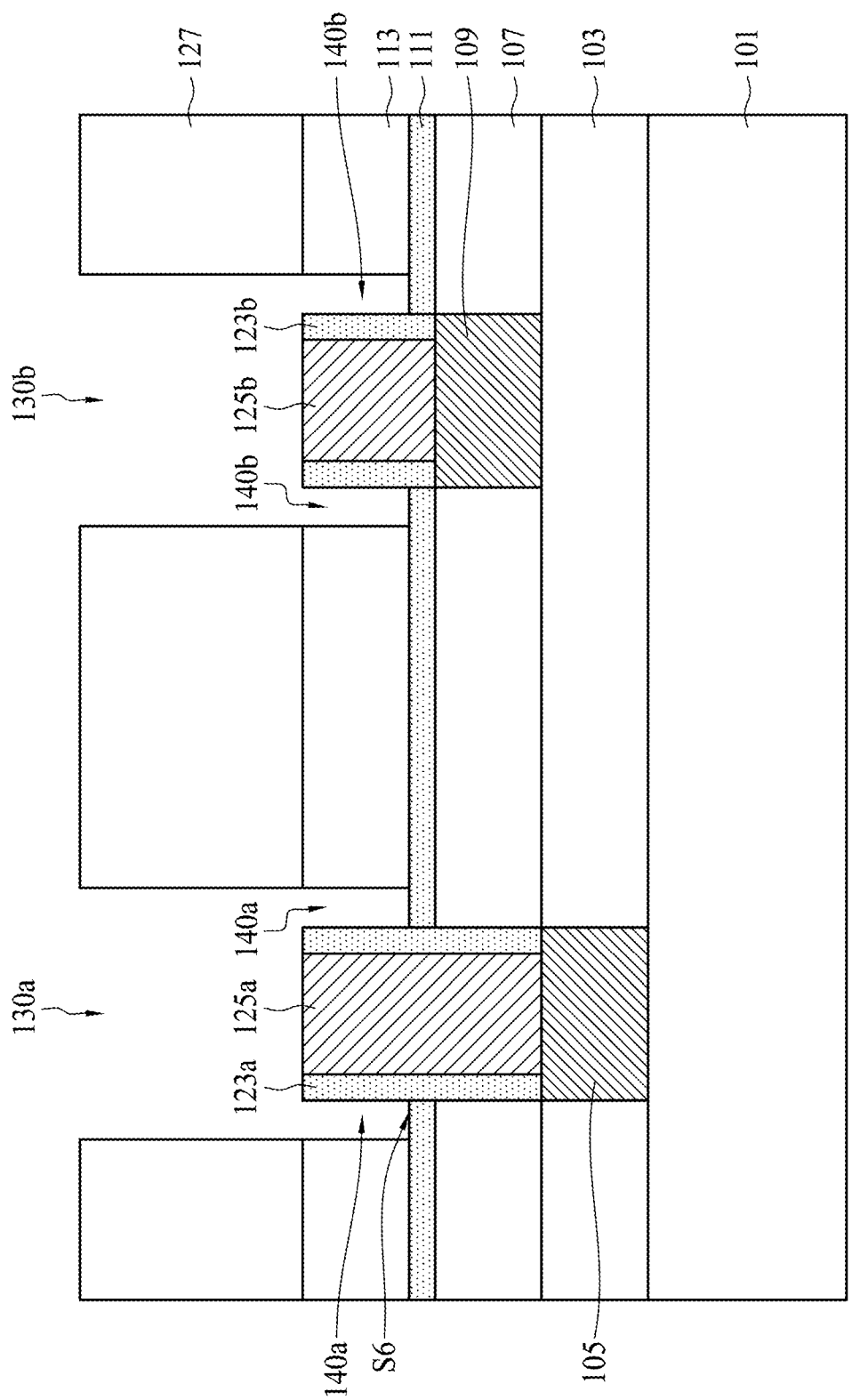
FIG. 8 is a cross-sectional view illustrating an intermediate stage in the formation of a semiconductor device structure, in accordance with some embodiments.

After the conductive plugs 125a and 125b are formed, a patterned mask 127 is disposed over the ILD layer 113, and the ILD layer 113 is patterned by using the patterned mask 127 as a mask, such that gaps 140a and 140b are formed adjacent to the first spacers 123a and 123b, as shown in FIG. 8 in accordance with some embodiments. The respective step is illustrated as the step S17 in the method 10 shown in FIG. 2.

More specifically, the patterned mask 127 has openings 130a and 130b. The conductive plug 125a, the first spacers 123a and portions of the ILD layer 113 adjacent to the first spacers 123a are exposed by the opening 130a, and the conductive plug 125b, the first spacers 123b and portions of the ILD layer 113 adjacent to the first spacers 123b are exposed by the opening 130b, in accordance with some embodiments.

In some embodiments, the patterned mask 127 is a patterned photoresist layer. Moreover, in some embodiments, the patterned mask 127 is formed by a deposition process and a patterning process. The deposition process for forming the patterned mask 127 may be CVD, high-density plasma CVD (HDPCVD), spin coating, sputtering, or another applicable process. The patterning process for forming the patterned mask 127 may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

After the patterned mask 127 is formed, the portions of the ILD layer 113 adjacent to the first spacers 123a and 123b are removed by a dry etching process, in accordance with some embodiments. In some embodiments, the etching selectivity of the ILD layer 113 with respect to the first spacers 123a, 123b and the etching selectivity of the ILD layer 113 with respect to the conductive plugs 125a, 125b are relatively high. Therefore, the portions of the ILD layer 113 are removed by the etching process while the first spacers 123a, 123b and the conductive plugs 125a, 125b may be substantially left, such that the gaps 140a and 140b are formed.

In some embodiments, the gaps 140a are formed between the first spacers 123a and the remaining portions of the ILD layer 113, and the gaps 140b are formed between the first spacers 123b and the remaining portions of the ILD layer 113. Next, the patterned mask 127 is removed. Furthermore, in some embodiments, the etch stop layer 111 and the first spacers 123a, 123b are made of the same material. Therefore, the etching process for forming the gaps 140a, 140b may be stopped as soon as the top surface S6 of the etch stop layer 111 is exposed in the gaps 140a, 140b.

Figure 9:
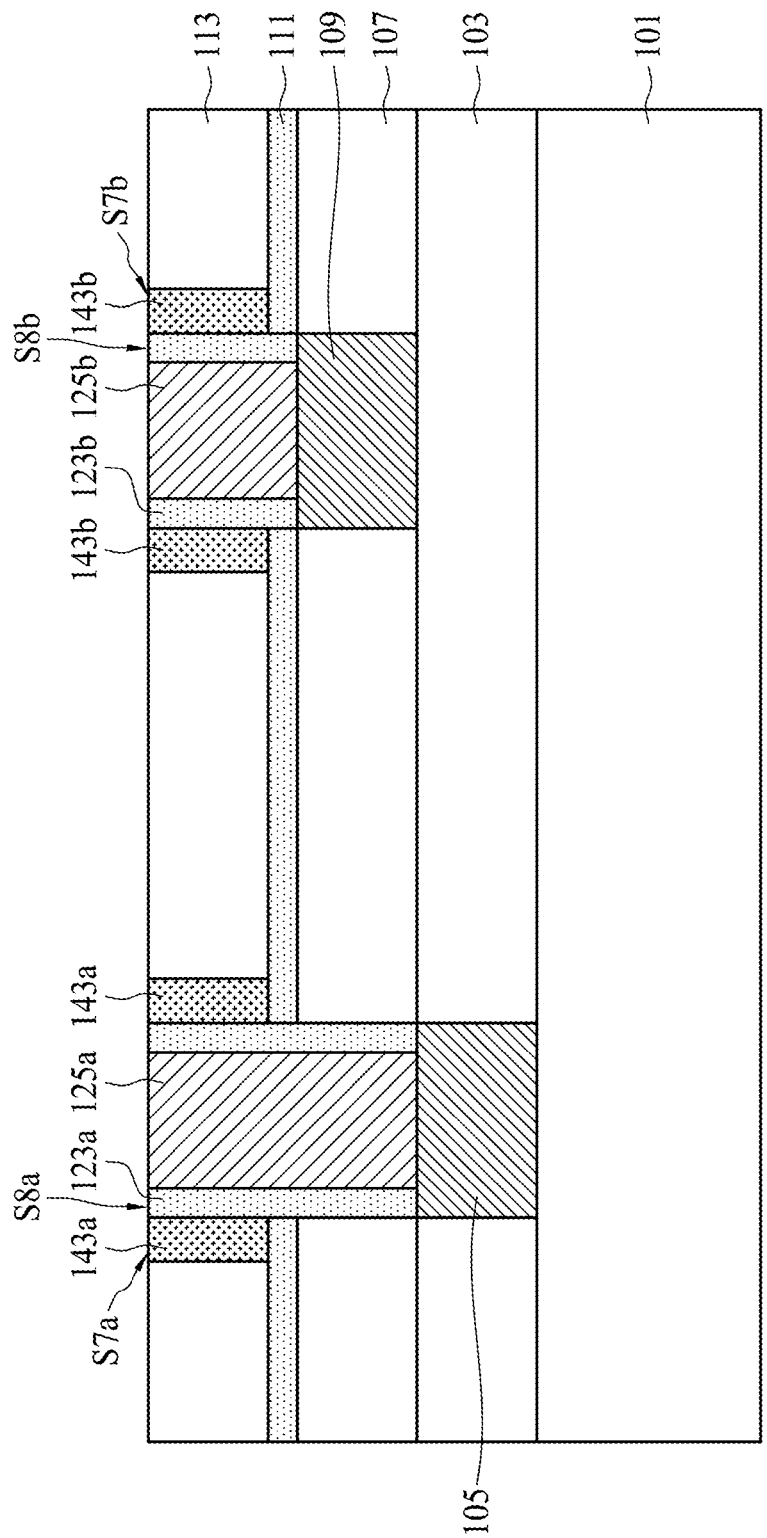
FIG. 9 is a cross-sectional view illustrating an intermediate stage in the formation of a semiconductor device structure, in accordance with some embodiments.

Next, an energy removable material 143a and 143b is deposited into the gaps 140a and 140b, as shown in FIGS. 8 and 9 in accordance with some embodiments. The respective step is illustrated as the step S19 in the method 10 shown in FIG. 2.

It should be noted that, in some embodiments, the energy removable material 143a and 143b includes a thermally decomposable material. In some other embodiments, the energy removable material 143a and 143b includes a photonic decomposable material, an e-beam decomposable material, or another applicable energy decomposable material. Specifically, in some embodiments, the energy removable material 143a and 143b includes a base material and a decomposable porogen material that is substantially removed by exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy removable material 143a and 143b (i.e., the gaps 140a and 140b) in the subsequent processes.

In some embodiments, the energy removable material 143a and 143b is formed by a deposition process and a subsequent planarization process, in accordance with some embodiments. The deposition process may be CVD, PVD, ALD, spin coating, or another applicable process, and the planarization process may be CMP. In some embodiments, after the planarization process, the top surface S7a of the energy removable material 143a is coplanar with the top surface S8a of the first spacers 123a, and the top surface S7b of the energy removable material 143b is level with (or coplanar with) the top surface S8b of the first spacers 123b.

Figure 10:
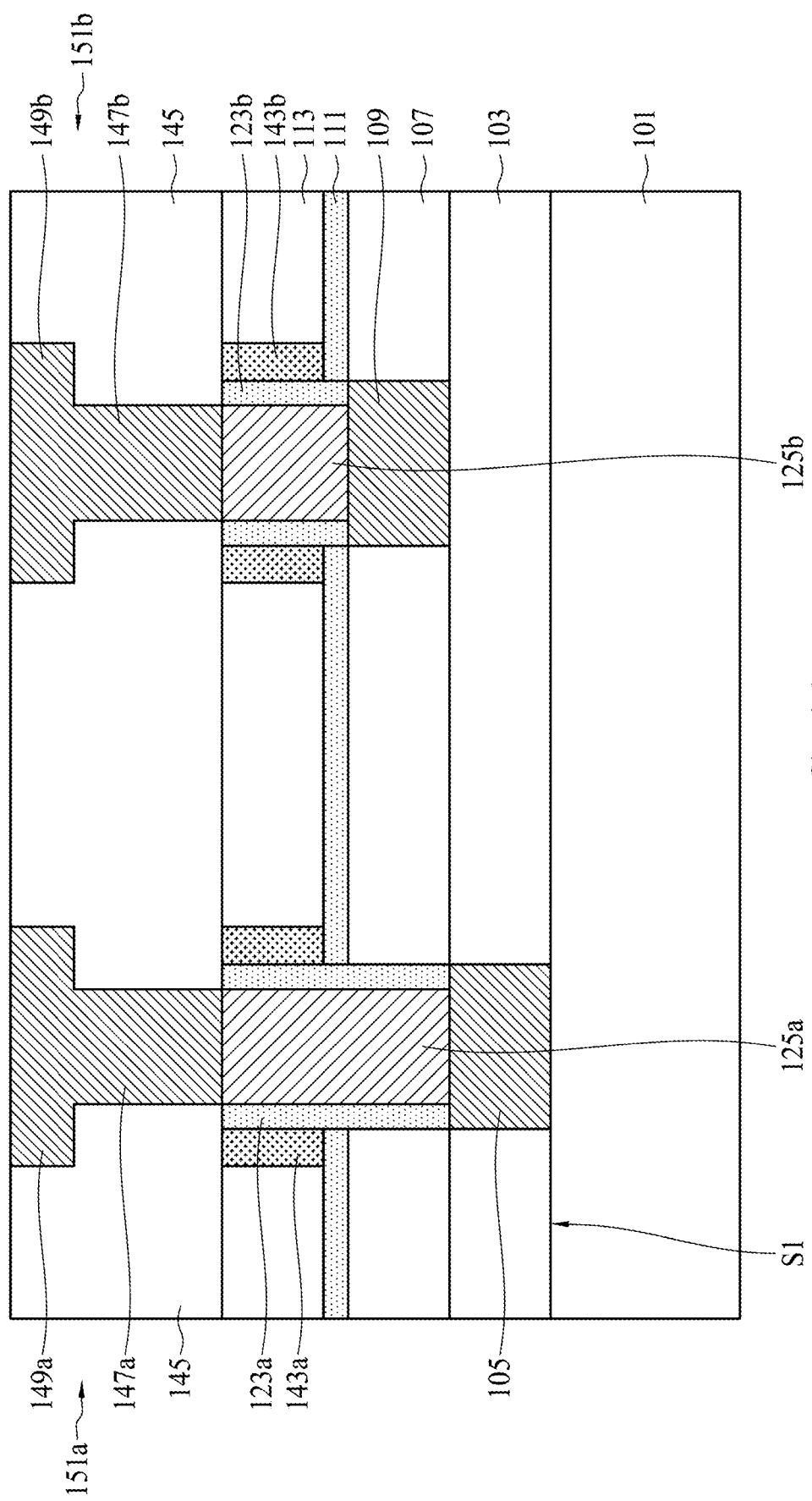
FIG. 10 is a cross-sectional view illustrating an intermediate stage in the formation of a semiconductor device structure, in accordance with some embodiments.

Next, the ILD layer 145 is formed so as to cover the ILD layer 113, the energy removable material 143a and 143b, the first spacers 123a, 123b and the conductive plugs 125a, 125b, and the conductive structures 151a and 151b are formed so as to penetrate through the ILD layer 145, as shown in FIG. 10 in accordance with some embodiments. The respective step is illustrated as the step S21 in the method 10 shown in FIG. 2.

In some embodiments, the conductive structure 151a includes the conductive contact 147a and the interconnect layer 149a, and the conductive structure 151b includes the conductive contact 147b and the interconnect layer 149b. It should be noted that the interconnect layers 149a and 149b are configured to electrically connect the conductive contacts 147a and 147b to an overlying wiring structure.

Some processes and materials used to form the ILD layer 145 and the conductive structures 151a and 151b are similar to, or the same as, those used to form the ILD layer 103 and the conductive structure 105, and detailed descriptions thereof are not repeated herein. It should be noted that the conductive structures 151a and 151b may be formed by a dual damascene process. In some embodiments, the conductive contacts 147a and 147b are in direct contact with the first spacers 123a and 123b. However, the conductive contacts 147a and 147b are separated from the energy removable material 143a and 143b, in accordance with some embodiments.

A heat treatment is performed to transform the energy removable material 143a and 143b into the second spacers 143a' and 143b', as shown in FIG. 1 in accordance with some embodiments. The respective step is illustrated as the step S23 in the method 10 shown in FIG. 2.

More specifically, in some embodiments, the heat treatment process is used to remove the decomposable porogen material of the energy removable material 143a and 143b to generate pores, and the base material of the energy removable material 143a and 143b accumulates at the lower portions of the space originally occupied by the energy removable material 143a and 143b due to gravity. The pores are filled by air after the decomposable porogen material is removed, such that the air gaps 143a" and 143b" are obtained over the remaining portions of the energy removable material 143a and 143b (i.e., the second spacers 143a' and 143b'), in accordance with some embodiments.

In other words, as a result of the heat treatment process, the energy removable material 143a and 143b is transformed into the second spacers 143a' and 143b', which are denser than the energy removable material 143a and 143b. In some embodiments, compared with the structure of FIG. 9, the top surface S7a of the energy removable material 143a is higher than the top surface S9a of the second spacers 143a' (i.e., the interface between the air gaps 143a" and the second spacers 143a'), and the top surface S7b of the energy removable material 143b is higher than the top surface S9b of the second spacers 143b' (i.e., the interface between the air gaps 143b" and the second spacers 143b').

In some other embodiments, the heat treatment process can be replaced by a light treatment process, an e-beam treatment process, a combination thereof, or another applicable energy treatment process. For example, an ultraviolet (UV) light or laser light may be used to remove the decomposable porogen material of the energy removable material 143a and 143b, such that the air gaps 143a", 143b" and the second spacers 143a', 143b' are obtained.

After the air gaps 143a" and 143b" are formed between the first spacers 123a, 123b and the ILD layer 113, the semiconductor device structure 100 is obtained. In the present embodiment, the semiconductor device structure 100 includes one or more field-effect transistors (FET), wherein the field-effect transistors are electrically connected by an interconnect structure (including the conductive structures 151a and 151b) over the semiconductor device structure 100.

Embodiments of the semiconductor device structure 100 and a method for forming the same are provided. The semiconductor device structure 100 includes the conductive plugs 125a and 125b over the conductive structures 105 and 109, the first spacers 123a and 123b on the sidewall surfaces SW1a and SW1b of the conductive plugs 125a and 125b, and the ILD layer 113 next to the conductive plugs 125a and 125b. Because the first spacers 123a, 123b and the ILD layer 113 have the air gaps 143a" and 143b" therebetween, the parasitic capacitance between the conductive plugs 125a and 125b and adjacent conductive elements may be reduced, thereby preventing or decreasing the unwanted resistive-capacitive (RC) delay. As a result, the operation speeds of the semiconductor device structure 100 may be increased, and the overall device performance may be improved.

In one embodiment of the present disclosure, a semiconductor device structure is provided. The semiconductor device structure comprises: a first conductive structure and a second conductive structure disposed at different vertical heights over a semiconductor substrate; a first conductive plug and a second conductive plug correspondingly disposed over the first conductive structure and the second conductive structure; a first spacer disposed on a sidewall surface of the first conductive plug; an etch stop layer disposed over the semiconductor substrate, wherein the etch stop layer adjoins the first spacer; and a first inter-layer dielectric (ILD) layer disposed over the etch stop layer and next to the first conductive plug, wherein the first ILD layer is separated from the first spacer by an air gap.

In another embodiment of the present disclosure, a semiconductor device structure is provided. The semiconductor device structure comprises: a first conductive structure and a second conductive structure disposed at different vertical heights over a semiconductor substrate; a first conductive plug and a second conductive plug correspondingly disposed over the first conductive structure and the second conductive structure, wherein the first conductive plug has a first height, the second conductive plug has a second height, and the second height is greater than the first height; a first spacer and a second spacer correspondingly disposed on a sidewall surface of the first conductive plug and a sidewall surface of the second conductive plug; an etch stop layer disposed over the conductive structure, wherein the etch stop layer adjoins a sidewall surface of the first spacer and a sidewall surface of the second spacer; a first inter-layer dielectric (ILD) layer disposed over the etch stop layer and next to the first spacer and the second spacer, wherein the first ILD layer is separated from the first spacer by a first air gap and the first ILD layer is separated from the second spacer by a second air gap; and a second ILD layer disposed over the first ILD layer, wherein the first air gap and the second air gap are sealed by the second ILD layer.

Embodiments of a semiconductor device structure are provided in accordance with some embodiments of the disclosure. The semiconductor device structure includes a conductive plug over a conductive structure, a first spacer on a sidewall surface of the conductive plug, and an inter-layer dielectric (ILD) layer next to the conductive plug. Because the first spacer and the ILD layer have an air gap therebetween, the parasitic capacitance between the conductive plug and another adjacent conductive element may be reduced. As a result, the operation speeds of the semiconductor device structure may be increased, and the overall device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
 a first conductive structure and a second conductive structure disposed at different vertical heights over a semiconductor substrate, wherein a bottom surface of the first conductive structure is vertically higher than a bottom surface of the second conductive structure;
 a first conductive plug and a second conductive plug correspondingly disposed over the first conductive structure and the second conductive structure;
 a first spacer disposed on a sidewall surface of the first conductive plug;
 an etch stop layer disposed over the semiconductor substrate, wherein the etch stop layer adjoins the first spacer; and
 a first inter-layer dielectric (ILD) layer disposed over the etch stop layer and next to the first conductive plug, wherein the first ILD layer is separated from the first spacer by an air gap.

2. The semiconductor device structure of claim 1, further comprising:
 a second spacer disposed over the etch stop layer, wherein the second spacer is between the first spacer and the ILD layer, and the air gap is over the second spacer.

3. The semiconductor device structure of claim 2, wherein the second spacer does not overlap the conductive structure in a direction perpendicular to a top surface of the semiconductor substrate.

4. The semiconductor device structure of claim 2, further comprising:
 a second ILD layer disposed over the first ILD layer, wherein the air gap is enclosed by the second ILD layer, the first ILD layer, the second spacer and the first spacer.

5. The semiconductor device structure of claim 4, further comprising:
 a first conductive contact disposed over the first conductive plug, wherein the first conductive contact is surrounded by the second ILD layer, and the first conductive contact is electrically connected to the first conductive plug.

6. The semiconductor device structure of claim 1, wherein a bottom surface of the etch stop layer is at a vertical height over a top surface of the first conductive structure.

7. The semiconductor device structure of claim 1, wherein the first conductive plug has a first height, the second conductive plug has a second height, and the second height is greater than the first height.

8. The semiconductor device structure of claim 1, wherein the first conductive plug has a first top surface, the second conductive plug has a second top surface, and the second top surface is substantially level with the first top surface.

9. The semiconductor device structure of claim 1, wherein the first conductive plug has a first height, the second conductive plug has a second height, the first conductive structure has a third height, and the second height is substantially the same as a summation of the first height and the third height.

10. The semiconductor device structure of claim 1, wherein the first conductive plug has a bottom surface substantially level with a bottom surface of the etch stop layer, and the second conductive plug has a bottom surface substantially lower than the bottom surface of the etch stop layer.

11. A semiconductor device structure, comprising:
a first conductive structure and a second conductive structure disposed at different vertical heights over a semiconductor substrate, wherein a bottom surface of the first conductive structure is vertically higher than a bottom surface of the second conductive structure;
a first conductive plug and a second conductive plug correspondingly disposed over the first conductive structure and the second conductive structure, wherein the first conductive plug has a first height, the second conductive plug has a second height, and the second height is greater than the first height;
a first spacer and a second spacer correspondingly disposed on a sidewall surface of the first conductive plug and a sidewall surface of the second conductive plug;
an etch stop layer disposed over the conductive structure, wherein the etch stop layer adjoins a sidewall surface of the first spacer and a sidewall surface of the second spacer;
a first inter-layer dielectric (ILD) layer disposed over the etch stop layer and next to the first spacer and the second spacer, wherein the first ILD layer is separated from the first spacer by a first air gap and the first ILD layer is separated from the second spacer by a second air gap; and
a second ILD layer disposed over the first ILD layer, wherein the first air gap and the second air gap are sealed by the second ILD layer.

12. The semiconductor device structure of claim 11, wherein the second spacer is between the air gap and the etch stop layer.

13. The semiconductor device structure of claim 12, wherein a material of the second spacer is different from a material of the first spacer and a material of the first ILD layer.

14. The semiconductor device structure of claim 11, wherein the first spacer and the etch stop layer are made of silicon nitride.

15. The semiconductor device structure of claim 11, wherein a bottom surface of the etch stop layer is at a vertical height over a bottom surface of the first spacer.

16. The semiconductor device structure of claim 11, wherein the air gap does not overlap the conductive structure in a direction perpendicular to a top surface of the semiconductor substrate.

17. The semiconductor device structure of claim 11, wherein the first conductive plug has a first height, the second conductive plug has a second height, and the second height is greater than the first height.

18. The semiconductor device structure of claim 11, wherein the first conductive plug has a first top surface, the second conductive plug has a second top surface, and the second top surface is substantially level with the first top surface.

19. The semiconductor device structure of claim 11, wherein the first conductive plug has a first height, the second conductive plug has a second height, the first conductive structure has a third height, and the second height is substantially the same as a summation of the first height and the third height.

20. The semiconductor device structure of claim 11, wherein the first conductive plug has a bottom surface substantially level with a bottom surface of the etch stop layer, and the second conductive plug has a bottom surface substantially lower than the bottom surface of the etch stop layer.

* * * * *